(12) United States Patent
Akaiwa

(10) Patent No.: US 6,859,099 B2
(45) Date of Patent: Feb. 22, 2005

(54) NONLINEAR DISTORTION COMPENSATION POWER AMPLIFIER

(75) Inventor: Yoshihiko Akaiwa, Munakata (JP)

(73) Assignee: Japan Science and Technology Corporation, Saitama (JP)

( * ) Notice: Subject to any disclaimer, the term of this patent is extended or adjusted under 35 U.S.C. 154(b) by 44 days.

(21) Appl. No.: 10/380,991

(22) PCT Filed: Sep. 19, 2001

(86) PCT No.: PCT/JP01/08134

§ 371 (c)(1),
(2), (4) Date: Mar. 19, 2003

(87) PCT Pub. No.: WO02/25808

PCT Pub. Date: Mar. 28, 2002

(65) Prior Publication Data

US 2004/0032296 A1 Feb. 19, 2004

(30) Foreign Application Priority Data

Sep. 19, 2000 (JP) .................................. 2000-283042

(51) Int. Cl.$^7$ .............................................. H03F 3/26
(52) U.S. Cl. ..................................... 330/149; 330/136
(58) Field of Search ............................. 330/129, 136, 330/149

(56) References Cited

U.S. PATENT DOCUMENTS 5,170,495 A * 12/1992 McNicol et al. ............ 455/116
5,675,288 A * 10/1997 Peyrotte et al. ............. 330/149
6,072,364 A * 6/2000 Jeckeln et al. ............. 330/149
RE37,407 E * 10/2001 Eisenberg et al. ............ 330/2

FOREIGN PATENT DOCUMENTS

| JP | 5-102739 | 4/1993 |
| JP | 5-268117 | 10/1993 |
| JP | 6-505604 | 6/1994 |
| JP | 8-37427 | 2/1996 |
| JP | 10-322137 | 12/1998 |
| JP | P2000-151295 | 5/2000 |
| JP | P2000-216640 | 8/2000 |
| JP | P2001-203539 | 7/2001 |

OTHER PUBLICATIONS

Nagata et al., 1989, Linear Amplification Technique for Digital Mobile Communications, Proceedings of the IEEE Vehicular Technology Conference, pp 159–164.

Antonio et al., 1999, Novel Adaptive Predistortion Technique for Power Amplifiers, Proceedings of the IEEE Vehicular Technology Conference, pp 1505–1509.

* cited by examiner

Primary Examiner—Steven J. Mottola
(74) Attorney, Agent, or Firm—McGlew and Tuttle, P.C.

(57) ABSTRACT

A nonlinear distortion compensating power amplifier is provided with a gain adjustment circuit and performs gain adjustment control so that the overall gain of the entire system including a power amplifier is always maintained at a constant value. While this gain adjustment is being performed, a control circuit determines an optimum distortion amount pattern corresponding to instantaneous values of an input signal supplied to a distortion signal generation circuit to enable this circuit to generate a distortion signal such that the power of unnecessary out-of-band signal components in an output signal from the power amplifier is minimized.

15 Claims, 5 Drawing Sheets

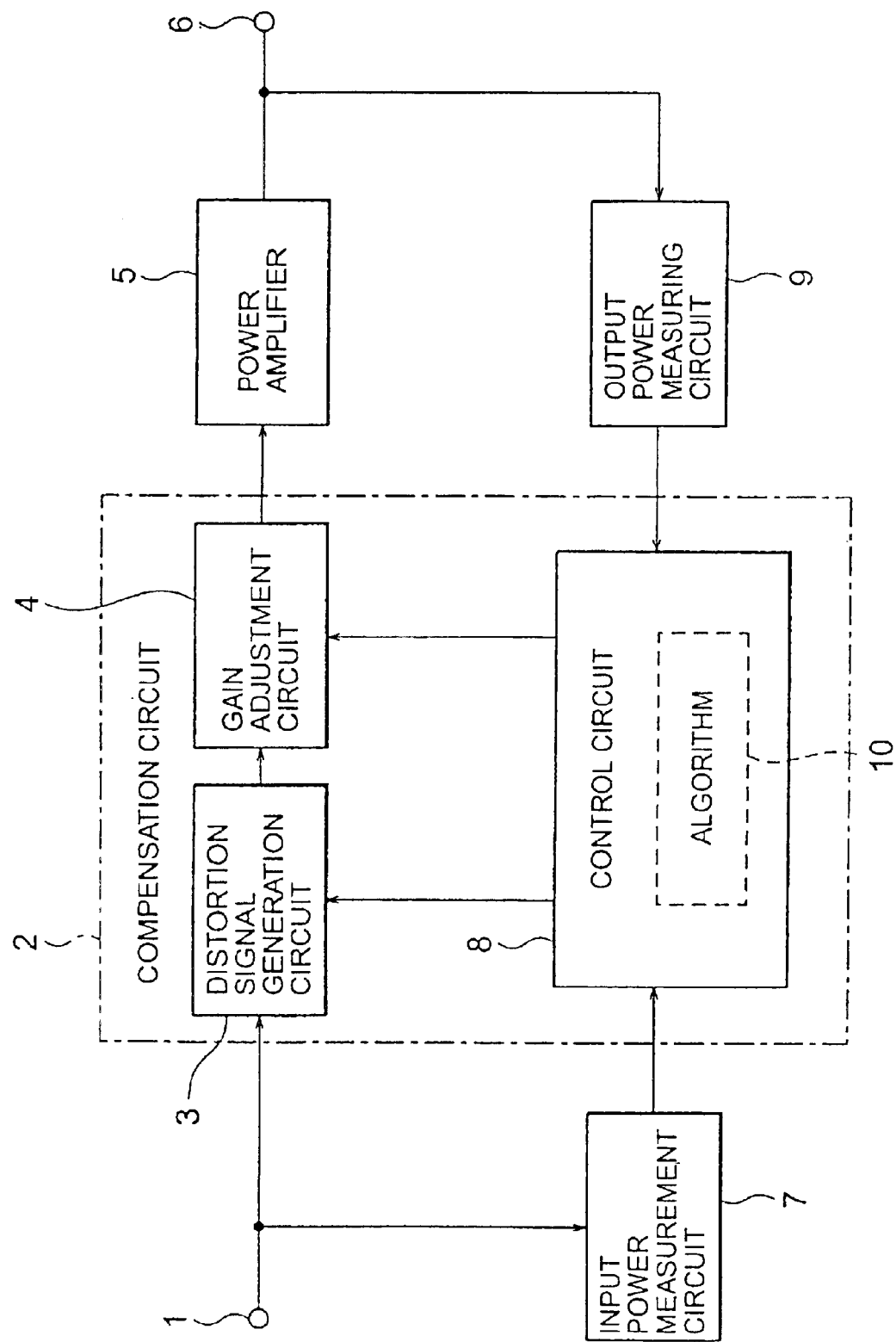

NONLINEAR DISTORTION COMPENSATION POWER AMPLIFIER

TECHNICAL FIELD

This invention relates to a nonlinear distortion compensating power amplifier, and more particularly to a nonlinear distortion compensating power amplifier which is suitable for simultaneously amplifying a linearly modulated signal or a plurality of modulated signals in a base station for mobile communication such as car telephone communication or portable telephone communication, and in which a predistorter for generating a distortion signal such as to cancel out a nonlinear distortion due to a characteristic of the power amplifier is provided in an input stage of the power amplifier thereby improving linear amplification performance.

BACKGROUND ART

In a power amplifier for power amplifying a linearly modulated wave or a plurality of modulated waves, there is a need to minimize nonlinear distortion for the purpose of suppressing unnecessary waves (spurious waves) and increasing the power efficiency. As conventional systems for compensation for nonlinear distortion in amplifiers, negative feedback systems, feedforward systems, predistorter systems, etc., are known.

Negative feedback systems find not many instances of use in wireless communication apparatuses for base stations because an oscillation phenomenon can occur easily therein in the case of amplification of signals in a wide band, and because the stability of the operation is thereby reduced.

Feedforward systems are considered theoretically free from instability of operation. Therefore they are presently used in wireless communication apparatuses for many base stations. Feedforward systems, however, need to have a configuration for extracting an error component, separately amplifying the error component by a sub amplifier, and subtracting the amplified error component from the output signal from a main amplifier and, therefore, have the problem that the circuit configuration is complicated and the power efficiency is reduced due to use of the sub amplifier.

Predistorter systems require no sub amplifier and therefore attract attention as systems replacing feedforward systems. Therefore, the development and study of predistorter systems are now being advanced. Predistorter systems attract attention because of their high power efficiency. A predistorter system cancels out a distortion generated in an amplifier by previously distorting the input signal. A predistorter system (predistorter) is known in which an out-of-band unnecessary wave (spurious wave) generated from a nonlinear distortion is measured and a distortion signal is generated so as to minimize the unnecessary wave. For example, there are known predistorter systems: one in the patent application "Japanese Patent Application 2000-9661" of the invention made by the inventor of the present invention, one described by Y. Nagata in the thesis "Linear Amplification Technique for Digital Mobile Communications", Proceedings of the IEEE Vehicular Technology Conference, pp. 159–164, 1989, and one described by F. Antonio and others in "A Novel Adaptive Predistortion Technique for Power Amplifiers", Proceedings of IEEE Vehicular Technology Conference, pp. 1505–1509, 1999.

In general, the gain of a power amplifier changes easily depending on an environmental condition, e.g., the power supply voltage, ambient temperature or passage of time, and a nonlinear distortion characteristic also changes depending on such an environmental condition. Nonlinear distortion compensating power amplifiers using conventional predistorter systems have a problem that a discrepancy occurs between a distortion signal generated by a predistorter and a nonlinear distortion characteristic of the power amplifier to impair the nonlinear distortion cancellation function.

DISCLOSURE OF INVENTION

An object of the present invention is to provide a nonlinear distortion compensating power amplifier using a predistorter system arranged so that the nonlinear distortion cancellation function is not impaired by variation in the gain of the power amplifier.

To achieve the above-described object, according to the present invention, there is provided a nonlinear distortion compensating power amplifier in which generation of a distortion signal by a distortion signal generation circuit (predistorter) is controlled and a gain adjustment circuit is provided to perform gain adjustment control so that the overall gain is always maintained at a constant value. This nonlinear distortion compensating power amplifier of the present invention may be arranged so as to have each of configurations described below.

The nonlinear distortion compensating power amplifier of the present invention has a power amplifier, a distortion signal generation circuit which is placed on the input side of the power amplifier, and which generates a distortion signal according to an input signal to cancel out a nonlinear distortion of the power amplifier, and a gain adjustment circuit which adjusts the overall gain so that the overall gain is constant.

Preferably, in the nonlinear distortion compensating power amplifier of the present invention, the distortion signal generated by the distortion signal generation circuit according to the input signal is determined in an optimum condition on the basis of an algorithm which minimizes the power of unnecessary out-of-band signal components in an output signal from the power amplifier.

Preferably, in the nonlinear distortion compensating power amplifier of the present invention, the gain of the gain adjustment circuit is controlled on the basis of comparison between the input signal power and the in-band signal power in the output signal so that the overall gain is a constant value.

Preferably, the nonlinear distortion compensating power amplifier of the present invention further has an input power measurement circuit which measures the input signal power, and an output power measurement circuit which measures the in-band signal power and the out-of-band signal power in the output signal.

Preferably, in the nonlinear distortion compensating power amplifier of the present invention, the output power measurement circuit is constituted by a frequency conversion circuit which coverts the output signal frequency of the power amplifier, a first filter and a second filter which respectively extract an in-band signal and an out-of-band signal from the frequency-converted output signal, and a power detector which measures each of the powers of the extracted in-band and out-of-band signals.

Preferably, in the nonlinear distortion compensating power amplifier of the present invention, the output signal has a plurality of bands in different frequency regions.

Preferably, the nonlinear distortion compensating power amplifier of the present invention further has a control circuit which controls the distortion signal generation circuit and the gain adjustment circuit on the basis of input signal power and output signal power.

Preferably, in the nonlinear distortion compensating power amplifier of the present invention, the control circuit has a restricted control algorithm enabling generation of an optimum distortion signal according to the input signal while maintaining the overall gain at a constant value.

Preferably, in the nonlinear distortion compensating power amplifier of the present invention, the restricted control algorithm includes a first control logic for controlling the gain adjustment circuit so that the overall gain is a constant value, and a second control logic for determining an optimum distortion amount pattern corresponding to instantaneous values of the input signal supplied to the distortion signal generation circuit to enable the same to generate a distortion signal such that the power of out-of-band signal components in the output signal is minimized, the first control logic and the second control logic being alternately executed.

Preferably, in the nonlinear distortion compensating power amplifier of the present invention, the gain adjustment circuit is placed between the distortion signal generation circuit and the power amplifier.

Preferably, in the nonlinear distortion compensating power amplifier of the present invention, the gain adjustment circuit is placed in a stage before the distortion signal generation circuit.

BRIEF DESCRIPTION OF THE DRAWINGS

FIG. 1A is a diagram showing a basic configuration of a nonlinear distortion compensating power amplifier in accordance with one aspect of the present invention.

BEST MODE FOR CARRYING OUT THE INVENTION

Figure 1B:
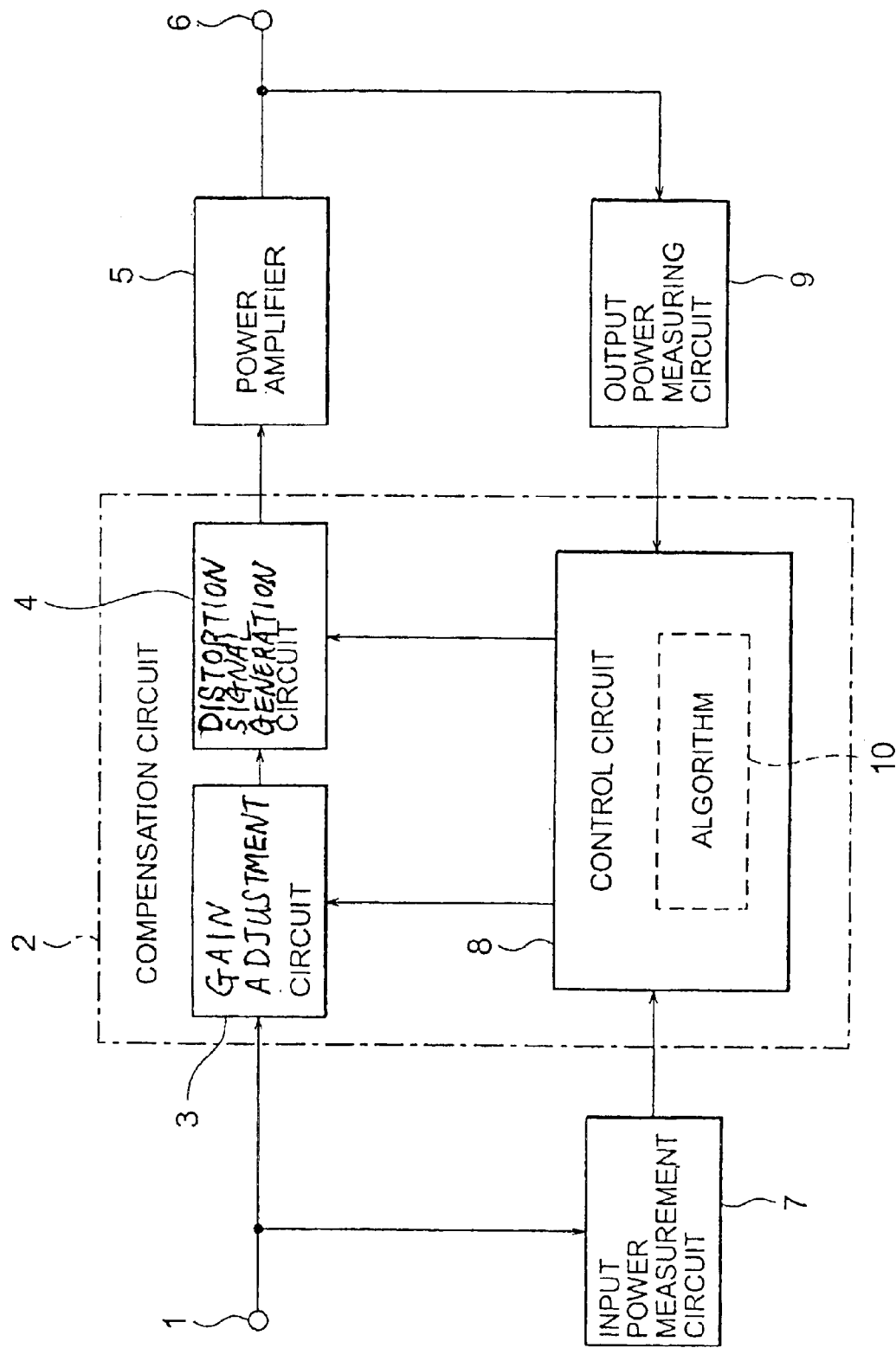
FIG. 1B is a diagram showing a basic configuration of a nonlinear distortion compensating power amplifier in accordance with another aspect of the present invention.

FIG. 1A shows a basic configuration of a nonlinear distortion compensating power amplifier in accordance with the present invention. Referring to FIG. 1A, the nonlinear distortion compensating power amplifier has an input terminal 1 through which a signal to be power-amplified is input, a compensation circuit 2 for making compensation for a nonlinear distortion in a power amplifier, a distortion signal generation circuit 3 for generating a distortion signal by causing a distortion according to instantaneous values of the input signal, a gain control adjustment circuit 4 for making compensation for variation in overall gain, a power amplifier 5 having a nonlinear distortion characteristic for which a compensation should be made, an output terminal 6 through which a power-amplified signal is output, an input power measurement circuit 7 for measuring the instantaneous power of the input signal, a control circuit 8 for controlling the generation of a distortion signal performed by the distortion signal generation circuit and gain setting performed by the gain control circuit, an output power measurement circuit 9 for measuring the average power signal components in a band to be amplified in the output signal and for measuring the average power of unnecessary out-of-band signal components, and an algorithm (i.e., a program) 10 for performing control of the generation of an optimum distortion signal and restricted control for constantly maintaining the overall gain.

The function and operation of the circuit shown in FIG. 1A will be described in detail in an illustrative way.

The distortion signal generation circuit 3, the gain adjustment circuit 4 in the compensation circuit 2 and the power amplifier 5 are connected in series between the input terminal 1 and the output terminal 6. The distortion signal generation circuit 3 causes in advance amplitude and phase distortions such as to be just cancelled out by the nonlinear distortion of the power amplifier 5 in the subsequent stage with respect to instantaneous values of the input signal appearing successively, thereby ensuring that no distortion appears in the output signal from the power amplifier. The control circuit 8 stores, in a memory not shown, the amount of distortion caused in the input signal according to the instantaneous power of the input signal, the amount of power being stored as a pattern of a sequence of amounts of distortion corresponding to instantaneous power values. When an instantaneous value of the input signal is detected, the control circuit 8 reads out from the memory the amount of distortion corresponding to the detected value, instructs the distortion signal generation circuit 3 to cause a distortion in the input signal, thereby generating a distortion signal. The distortion caused at this time in the input signal comprises an amplitude distortion and a phase distortion (no phase distortion may be caused in some case) and is optimized so as to be just cancelled out by the nonlinear distortion characteristic of the power amplifier 5.

The distortion signal generation circuit 3 is constituted by a variable gain control circuit for causing a distortion in the amplitude of the input signal according to a control signal from the control circuit 8, and a variable phase control circuit for causing a distortion in the input signal according to a control signal from the control circuit 8.

The gain adjustment circuit 4 is constituted by a variable attenuator and is controlled so as to make a compensation for a change in overall gain by changing the amount of attenuation when the change in overall gain is detected. The overall gain is thereby maintained at a constant level.

The power of the input signal and the power of the output signal required for control by the control circuit 8 are measured by the input power measurement circuit 7 and the output power measurement circuit 9 and the measured values of the powers are sent to the control circuit 8. The input power measurement circuit 7 measures the instantaneous power and the average power of the input signal applied to the input terminal 1. If the input power measurement circuit 7 measures only the instantaneous power, and if the control circuit 8 computes the average power, the input power measurement circuit 7 can be simplified. Similarly, the output power measurement circuit 9, with respect to the output signal from the output terminal 6, separately measures the average power of signal components in a desired frequency band contained in the output signal and the average power of unnecessary signal components out of the band, and sends the results of measurement to the control circuit 8.

The distortion signal generation circuit 3 is thereby enabled to convert the input signal applied to the input terminal 1 into a distortion signal having distortions in amplitude and phase according to instantaneous values of the input signal. The distortion signal is amplitude-adjusted by gain compensation in the gain adjustment circuit 4 and is input to the power amplifier 5. The output signal power-amplified by the power amplifier 5 and having the distortions reduced is output through the output terminal 6. The gain adjustment circuit 4, inserted between the distortion signal generation circuit 3 and the power amplifier 5 as illustrated, may alternatively be placed between the input terminal 1 and the distortion signal generation circuit 3. Each of the distortion signal generation circuit 3 and the gain adjustment circuit 4 is controlled by the algorithm 10 in the control circuit 8. The algorithm 10 is a control means realized by executing on a CPU (not shown) a program for execution of the control, which is stored in a main memory (not shown).

The overall gain value and the distortion characteristic of the amplifier are in such a relationship as to influence each other; if one of them is changed, the other is also changed. As the algorithm 10 in the control circuit 8, therefore, a restricted control algorithm is used such that the distortion signal is optimized while the overall gain is controlled so as to be always maintained at a constant target value. This restricted control algorithm is realized by alternately executing control for adjusting the overall gain to a constant value and control for optimizing the distortion signal until a converged state is finally reached.

Control for adjusting the overall gain to a constant value is performed in such a manner that the overall gain is computed from the average power of the input signal and the average power of signal components of the output signal in the desired band; a deviation of gain variation is obtained by comparing the computed overall gain value with a constant reference value; and the gain adjustment circuit 4 is instructed to make an adjustment according to a gain compensation value such that this deviation becomes zero. Thus, the overall gain is controlled to be maintained at a constant value.

In distortion signal optimization control performed after this control of the overall gain at a constant value, a plurality of various distortion amount patterns are generated and the most suitable one of the generated distortion amount patterns is selected. With respect to this control, the algorithm 10 may be, for example, one for a method in which different distortion amount patterns are successively generated in a trial-and-error manner; the distortion signal generation circuit 3 is instructed to generate the distortion signal based on the amount of distortion in each pattern in correspondence with instantaneous values of the input signal; the average power of out-of-band signal components contained in the signal output from the amplifier is monitored while the distortion signal is being generated; and the distortion amount pattern corresponding to the first time that the average power value of out-of-band signal components has become equal to or smaller than an allowable value is selected as an optimum one. Alternatively, a method may be used in which all the types of distortion amount pattern are generated; the generation of the distortion signal is executed with respect to each distortion amount pattern; and one of the distortion amount patterns minimizing the average power value of out-of-band components is selected as an optimum one. In either method, there is a need to execute the above-described algorithm for controlling the overall gain at a constant value when each of new distortion amount patterns is used.

To generate a plurality of various distortion amount patterns, a method of successively changing a distortion amount pattern by computation or a method in which a plurality of distortion amount patterns are stored in a memory and are selected one after another may be used.

FIG. 1B shows an alternative arrangement of the distortion signal generation circuit 3 and gain adjustment circuit 4.

Figure 2:
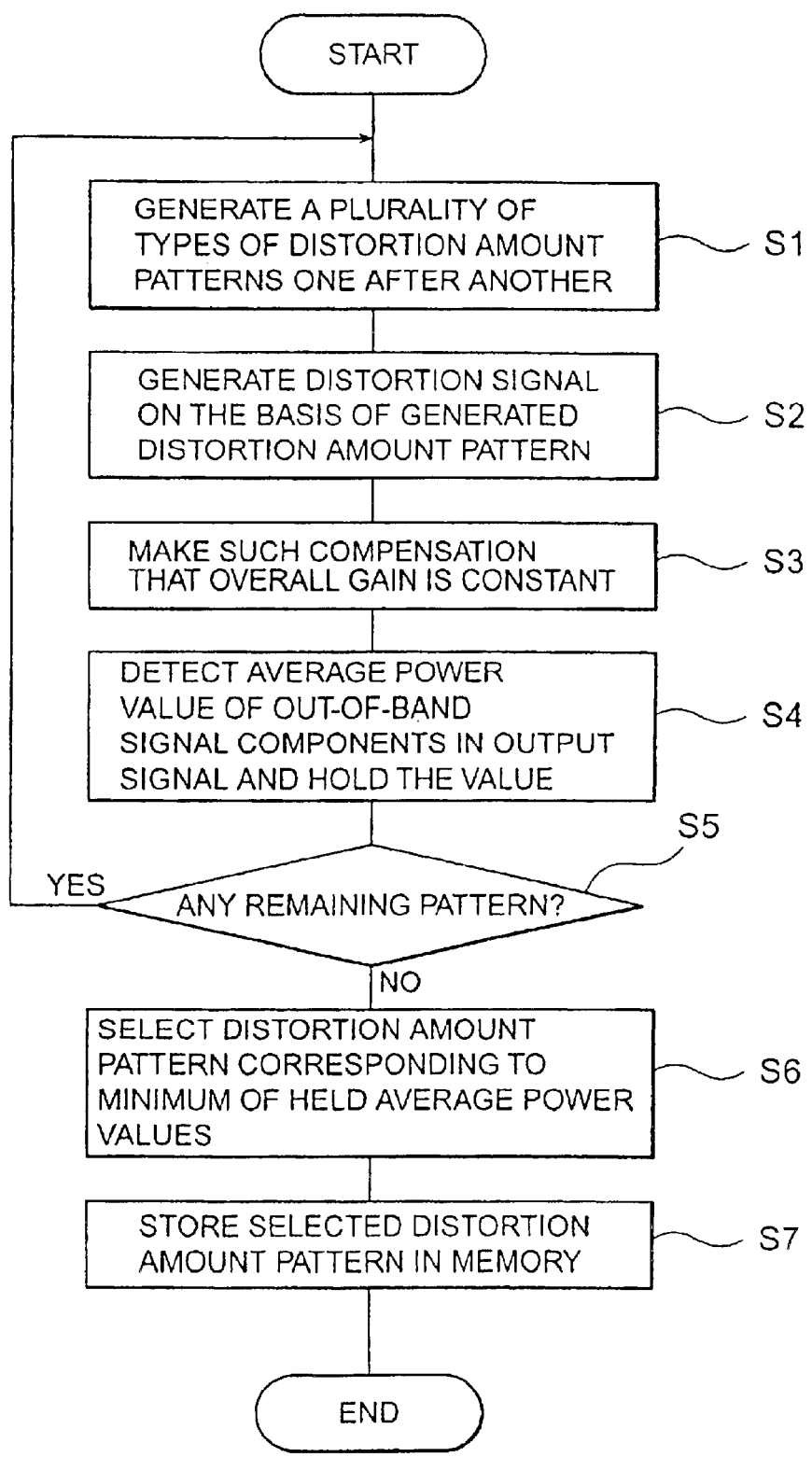
FIG. 2 is a flowchart showing an example of an algorithm in accordance with the present invention.

FIG. 2 shows an example of a restricted control algorithm for optimizing the distortion signal under a condition that the overall gain is constant. In the algorithm 10 shown in FIG. 1A, if there is a distortion amount pattern already generated, another different distortion amount pattern is generated (step S1); a distortion signal is generated on the basis of the generated distortion amount pattern (step S2); the overall gain is detected and a compensation is made for a change in gain to maintain the overall gain at a constant value (step S3); and the average power value of out-of-band signal components contained in the output signal is thereafter detected and stored (step S4). Processing from above-described steps S1 to S4 is repeated with respect to each of a plurality of distortion amount patterns successively generated as patterns different from each other. If no other distortion amount pattern to be generated (supposed to be generated) exists (step S5), the stored average power values related to the distortion amount patterns are compared and the pattern corresponding to the minimum of the average power values is selected (step S6) and stored as an optimum pattern in the memory (step S7).

Control based on this algorithm 10 is performed at the time of startup and repeated at suitable intervals during operation to enable an optimum distortion signal to be generated in such a state that the overall gain is always maintained at a constant value without being influenced by environmental changes, thus enabling stable accurate compensation for a nonlinear distortion in the power amplifier.

Figure 3:
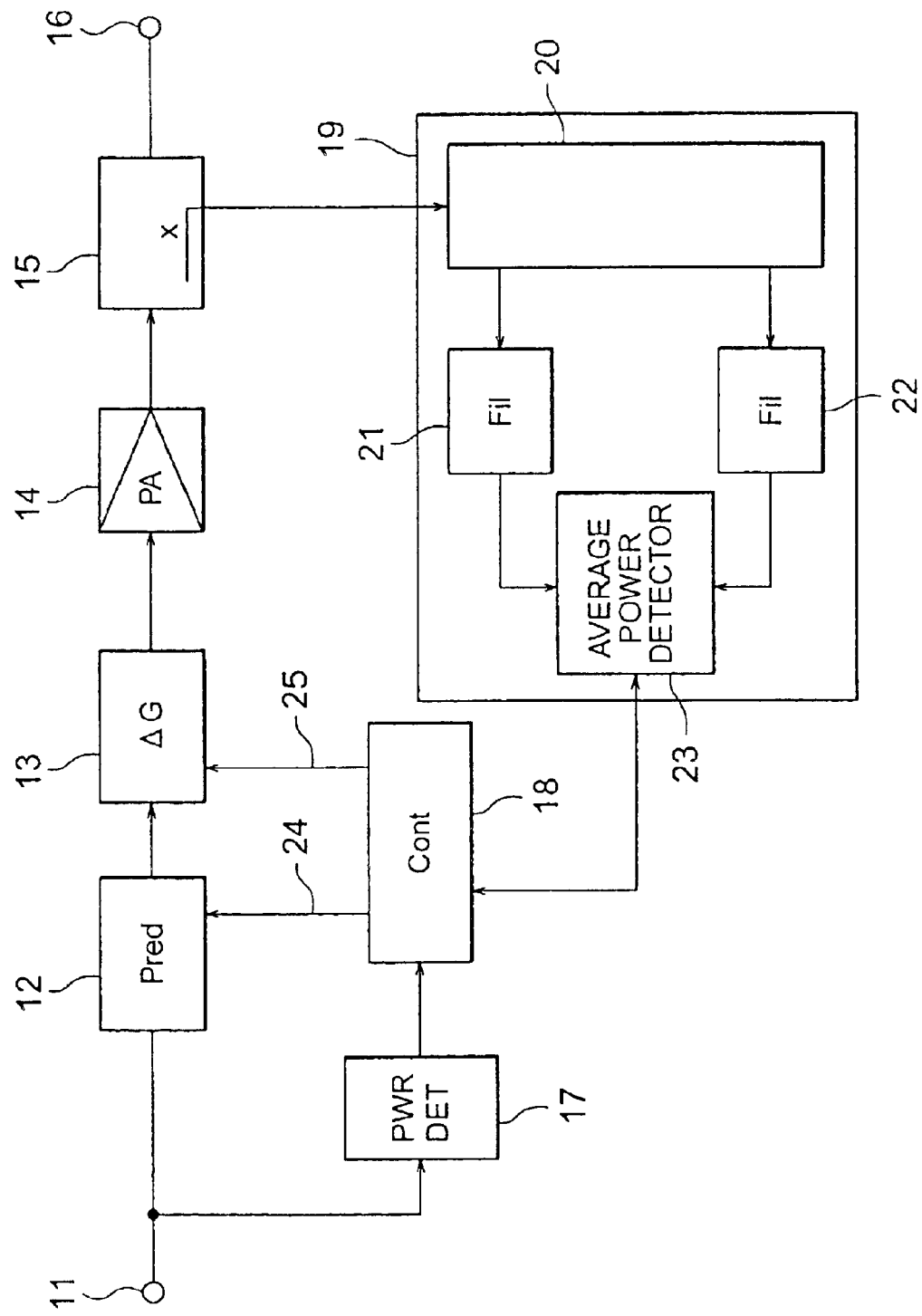
FIG. 3 is a diagram showing the configuration of a nonlinear distortion compensating power amplifier according to one embodiment of the present invention.

FIG. 3 shows the configuration of a nonlinear distortion compensating power amplifier according to one preferred embodiment of the present invention. Referring to FIG. 3, the nonlinear distortion compensating power amplifier has an input terminal 11, a predistorter (Pred) 12, a gain adjustment circuit ($\Delta G$) 13, a power amplifier (PA) 14, a directional coupler 15, an output terminal 16, an input power measurement circuit (PWR DET) 17, a control circuit (Cont) 18, an output power measurement circuit 19, a frequency conversion circuit 20, filters 21 and 22, and an average power detector 23. The control circuit 18 has an algorithm 10 (not shown).

A signal such as a mobile communication signal input through the input terminal 11 is given amplitude and phase distortions by the predistorter 12. An output signal from the predistorter 12 is fed forward through the gain adjustment circuit 13, amplified by the power amplifier 14, and supplied to the output terminal 16 via the directional coupler 15 to be output. Part of the output signal is extracted by the directional coupler 15 and input to the output power measurement circuit 19 is frequency-converted by the frequency conversion circuit 20 and is thereafter input to the filters 21 and 22. The filter 21 is a filter for extracting the portion of the output signal in a desired band to be amplified. The filter 22 is a filter for extracting unnecessary portions of the signal out of the band. Outputs from the filters 21 and 22 are respectively input to the average power detector 23, and the in-band signal average power and the out-of-band unnecessary signal average power are measured by the average power detector 23. Detection outputs from the average power detector 23 are input to the control circuit 18. Part of the input signal is input to the input power measurement circuit 17 and the instantaneous power of the signal is measured in this circuit. A measurement output from the input power measurement circuit 17 is input to the control circuit 18.

The control circuit 18 obtains the amounts of amplitude and phase distortions according to instantaneous power values of the input signal by using each of patterns of correspondence between instantaneous power values and distortion amounts stored in an internal memory (not shown) in advance, and instructs the predistorter 12 to generate a distortion signal by causing distortions in the input signal according to the amounts of distortion. The amounts of amplitude and phase distortions supplied to the predistorter 12 at this time vary depending on the instantaneous power value of the input signal, and the values of the amounts are determined in advance so as to cancel out a nonlinear distortion in the power amplifier 14 on the basis of the principle of the predistorter system.

Distortion amount patterns stored in the memory are prepared to enable optimum cancellation of the nonlinear distortion of the power amplifier 14, and can be updated as desired at the time of startup or during operation. An optimum one of various distortion amount patterns generated by computation is selected as a pattern minimizing the average power value of out-of-band unnecessary signals of the output from the filter 22 by using an algorithm for a trial-and-error method (or a repetition method) and is stored in the memory (see, for example, the above-mentioned Japanese Patent Application 2000-9661). In this embodiment, the amounts of distortion stored in the memory in the control circuit are automatically determined by the suitable algorithm 10 based on such a method.

The control circuit 18 first obtains the average power value from the instantaneous power of the input signal, which is an output from the input power measurement circuit 17, and obtains the overall gain by computing the ratio of this value and the average power value signal component in the desired band in the amplifier output signal output from the output power measurement circuit 19. If the obtained gain is different from a given reference value, the control circuit 18 controls the gain of the gain adjustment circuit 13 so that the computed and given gains coincide with each other. After this gain adjustment, updating of the distortion amount pattern is executed by the algorithm 10. The gain adjustment circuit 13 may be placed before the predistorter 12.

Figure 4:
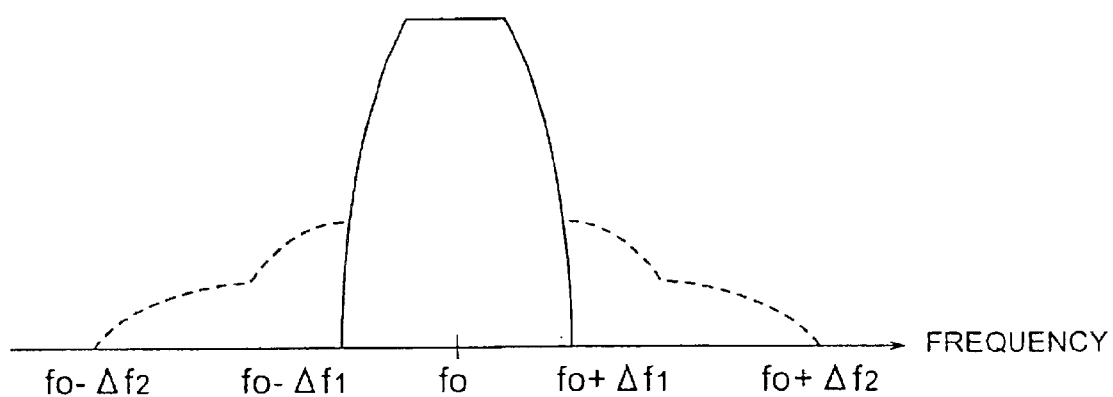
FIG. 4 is a diagram showing a signal power spectrum in one embodiment of the present invention.
Figure 5:
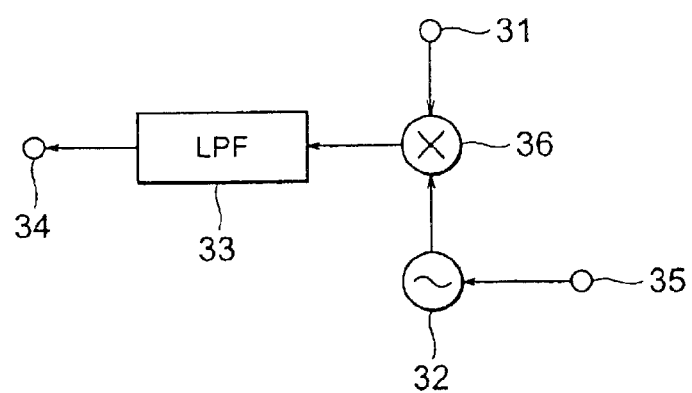
FIG. 5 is a diagram showing the configuration of a frequency conversion circuit in one embodiment of the present invention.

FIG. 4 shows a signal power spectrum in the embodiment of the present invention, and FIG. 5 shows an example of the frequency conversion circuit 20 shown in FIG. 3.

In FIG. 4, the solid line indicates a power spectrum of the output signal in an ideal case where no linear distortion exists in the power amplifier, and the broken line indicates unnecessary out-of-band signals (spurious signals) generated by a nonlinear distortion. In the arrangement shown in FIG. 3, the filter 22 extracts these out-of-band signal components, the average power detector 23 measures the average power of the signal, and a distortion amount pattern minimizing this average power value is determined by the algorithm 10 (not shown) in the control circuit 18.

In the frequency converter circuit shown in FIG. 5, part of the output signal branching off from the directional coupler 15 shown in FIG. 3 is supplied to an input terminal 31, and a frequency-converted signal is output through an output terminal 34. The input signal to the input terminal 31 is input to a frequency mixer 36 together with a local oscillation signal output from a local oscillator 32, and frequency components corresponding to the difference between these signals are extracted by a low-band filter 33. The oscillation frequency of the local oscillator 32 can be changed by a signal input to a control terminal 35, and is set to a center frequency $f_0$ of the power spectrum shown in FIG. 4 in this example. The signal output from the output terminal 34 is input to the filters 21 and 22 shown in FIG. 3. The filter 21 is formed as a low-pass filter having a passband from 0 to $\Delta f_1$. Since the local oscillation frequency is set at $f_0$, the signal in the desired band indicated by the solid line in FIG. 4 is extracted from the filter 21. On the other hand, the passband of the filter 22 is set from $\Delta f_1$ to $\Delta f_2$ to enable out-of-band signals indicated by the broken line in FIG. 4 to be extracted from the filter 22.

The average power detector 23 shown in FIG. 3 separately measures the average power of each of the output signals from the filters 21 and 22. The control circuit 18 obtains in advance the input signal average power value from the instantaneous power of the input signal, which is the output from the input power measurement circuit 17. In processing by the algorithm 10 of the control circuit 18, a certain amount of distortion is caused in the input signal and the in-band average power of the output signal from the filter 21 is observed. The ratio of this observed value and the average power value of the input signal previously measured is obtained to compute the power gain from the input terminal 11 to the output terminal 16. If the computed power value is different from the predetermined power gain reference value, the gain of the gain adjustment circuit 13 is adjusted so that these values coincide with each other. By the algorithm 10, after the completion of this gain adjustment, determination of the optimum distortion amount pattern for control of the predistorter 12 and updating of the memory are performed.

The embodiment has been described by assuming the single-band signal spectrum shown in FIG. 4. However, even in a case where a plurality of signal bands exist on the frequency axis, it is possible to measure in-band powers and out-of-band powers of the amplifier output signal by suitably setting the local oscillation frequency and the filters 21 and 22.

INDUSTRIAL APPLICABILITY

According to the present invention, the predistorter can be operated while the overall gain is constantly maintained, even if the characteristics of the power amplifier are changed due to an environmental change or a change with time. Consequently, the desired nonlinear compensation performance can be maintained.

What is claimed is:

1. A nonlinear distortion compensating power amplifier comprising:

a power amplifier;

a distortion signal generation circuit being placed on the input side of the power amplifier, and to generate a distortion signal according to an input signal to cancel out a nonlinear distortion of the power amplifier; and a gain adjustment circuit to adjust an overall gain so that the overall gain is constant, wherein the distortion signal generated by the distortion signal generation circuit according to the input signal is determined on a basis of an algorithm which minimizes a power of unnecessary out-of-band signal components in an output signal from the power amplifier.

2. A nonlinear distortion compensating power amplifier comprising:

a power amplifier;

a distortion signal generation circuit being placed on the input side of the power amplifier, and to generate a distortion signal according to an input signal to cancel out a nonlinear distortion of the power amplifier;

a gain adjustment circuit to adjust an overall gain so that the overall gain is constant;

an input power measurement circuit to measure an input signal power; and an output power measurement circuit to measure an in-band signal power and an out-of-band signal power in an output signal.

3. A nonlinear distortion compensating power amplifier according to claim 2, wherein the output power measurement circuit is constituted by a frequency conversion circuit which coverts the output signal frequency of the power amplifier, a first filter and a second filter which respectively extract an in-band signal and an out-of-band signal from the frequency-converted output signal, and a power detector which measures each of the powers of the extracted in-band and out-of-band signals.

4. A nonlinear distortion compensating power amplifier according to claim 3, wherein the output signal has a plurality of bands in different frequency regions.

5. A nonlinear distortion compensating power amplifier according to claim 1, further comprising:

a control circuit to control the distortion signal generation circuit and the gain adjustment circuit on a basis of an input signal power and output signal power.

6. A nonlinear distortion compensating power amplifier according to claim 5, wherein the control circuit has a restricted control algorithm enabling generation of an optimum distortion signal according to the input signal while maintaining the overall gain at a constant value.

7. A nonlinear distortion compensating power amplifier according to claim 6, wherein the restricted control algorithm includes a first control logic for controlling the gain adjustment circuit so that the overall gain is a constant value, and a second control logic for determining an optimum distortion amount pattern corresponding to instantaneous values of the input signal supplied to the distortion signal generation circuit to enable the distortion signal generation circuit to generate a distortion signal such that the power of out-of-band signal components in an output signal is minimized, the first control logic and the second control logic being alternately executed.

8. A nonlinear distortion compensating power amplifier according to claim 1, wherein the gain adjustment circuit is placed between the distortion signal generation circuit and the power amplifier.

9. A nonlinear distortion compensating power amplifier according to claim 1, wherein the gain adjustment circuit is placed in a stage before the distortion signal generation circuit.

10. A nonlinear distortion compensating power amplifier according to claim 1, wherein the gain of the gain adjustment circuit is controlled on the basis of the input signal power and the in-band signal power in the output signal so that the overall gain is a constant value.

11. A nonlinear distortion compensating power amplifier according to claim 2, further comprising:

a control circuit to control the distortion signal generation circuit and the gain adjustment circuit on a basis of an input signal power and output signal power.

12. A nonlinear distortion compensating power amplifier according to claim 11, wherein the control circuit has a restricted control algorithm enabling generation of an optimum distortion signal according to the input signal while maintaining the overall gain at a constant value.

13. A nonlinear distortion compensating power amplifier according to claim 12, wherein the restricted control algorithm includes a first control logic for controlling the gain adjustment circuit so that the overall gain is a constant value, and a second control logic for determining an optimum distortion amount pattern corresponding to instantaneous values of the input signal supplied to the distortion signal generation circuit to enable the distortion signal generation circuit to generate a distortion signal such that the power of out-of-band signal components in an output signal is minimized, the first control logic and the second control logic being alternately executed.

14. A nonlinear distortion compensating power amplifier according to claim 2, wherein the gain adjustment circuit is placed between the distortion signal generation circuit and the power amplifier.

15. A nonlinear distortion compensating power amplifier according to claim 2, wherein the gain adjustment circuit is placed in a stage before the distortion signal generation circuit.

* * * * *